United States Patent [19]
Pei et al.

[11] Patent Number: 6,062,890
[45] Date of Patent: May 16, 2000

[54] ELECTRICAL CONNECTOR

[75] Inventors: Wen-Chun Pei; Yu-Min Wang, both of Taipei, Taiwan

[73] Assignee: Hon Hai Precision Ind. Co., Ltd., Taipei Hsien, Taiwan

[21] Appl. No.: 09/385,245

[22] Filed: Aug. 28, 1999

[30] Foreign Application Priority Data

Apr. 9, 1999 [TW] Taiwan ................................ 88205504

[51] Int. Cl.⁷ ................................................ H01R 13/625
[52] U.S. Cl. ............................ 439/342; 439/70; 439/381
[58] Field of Search ............................... 439/342, 70–73, 439/83, 525, 526, 876, 259–270, 381

[56] References Cited

U.S. PATENT DOCUMENTS

| | | | |
|---|---|---|---|
| 5,044,973 | 9/1991 | Noda et al. | 439/342 |
| 5,092,789 | 3/1992 | Sinclair | 439/342 |
| 5,535,513 | 7/1996 | Frantz | 439/83 |
| 5,611,705 | 3/1997 | Pfaff | 439/342 |
| 5,658,160 | 8/1997 | Lai | 439/342 |
| 5,730,615 | 3/1998 | Lai et al. | 439/342 |
| 5,746,608 | 5/1998 | Taylor | 439/83 |
| 5,797,774 | 8/1998 | Kaneko | 439/342 |

Primary Examiner—Gary F. Paumen
Attorney, Agent, or Firm—Wei Te Chung

[57] ABSTRACT

An electrical connector for interconnecting an IC module and a circuit board comprises a base, a slide plate, a plurality of contacts, a spacing plate, a prepreg, a cover and a push plate. A plurality of passageways is formed in the base for receiving corresponding contacts. The slide plate is mounted on a top surface of the base, and a plurality of apertures is formed in the slide plate corresponding to the passageways of the base. The spacing plate is mounted to a bottom surface of the base and forms a plurality of positioning holes for receiving soldering portions of the corresponding contacts. The prepreg is disposed between the base and the spacing plate, and a plurality of spacing holes is formed in the prepreg corresponding to the passageways of the base. Since the spacing plate and the circuit board have the same thermal expansion coefficient, the positioning holes remain in alignment with corresponding solder pads formed on the circuit board during a soldering process. Furthermore, the contacts are resilient to compensate for deformation of the electrical connector and the circuit board. Thus, a reliable connection between the circuit board and the IC module is provided.

3 Claims, 7 Drawing Sheets

ELECTRICAL CONNECTOR

BACKGROUND OF THE INVENTION

The present invention relates to an electrical connector, and particularly to an electrical connector for mounting an IC module to a circuit board and preventing misalignment between the IC module and the circuit board.

As the demand for high-speed notebook computer increases, IC modules are accordingly designed to fulfill the need. Conventional connectors for reliably connecting an IC module to a circuit board and for ensuring stable signal transmission are disclosed in Taiwan Patent Application Nos. 86100198 and 86207996.

Referring to FIGS. 1A to 1C, a contact 81 of a conventional connector for electrically connecting an IC module to a circuit board 9 generally comprises a fixing portion 811 and a soldering portion 812. A pair of engaging portions 813 is formed on opposite edges of the contact 81 for engaging with inner surfaces of a corresponding passageway 821 of a housing 82 thereby securing the pin 81 to the housing 82. To solder the contact 81 to a corresponding solder pad 91 formed on the circuit board 9, a solder ball 92 is attached to the solder portion 812 of the contact 81. The solder ball 92 is attached on the corresponding solder pad 91 and melted to engage with the solder pad 91 by a heating process. Thus, the IC module is electrically connected with the circuit board 9.

However, the thermal expansion coefficient of the housing 82 is different from that of the circuit board 9. Thus, when thermal expansion occurs during the heating process, the contact 81 may be improperly soldered to the solder pad 91 (FIG. 1C). Therefore, signal transmission between the contact 81 and the circuit board 9 is unreliable. Furthermore, if the contact 81 is soldered to the solder pad 91 at an ideal position (FIG. 1B), heat is generated while the contact 81 and the circuit board 9 are in operation thereby causing the connector and the circuit board 9 to expand and causing misalignment between the contacts 81 and the solder pads 9. Thus, reliable connection between the contacts 81 and the circuit board 9 is not provided.

BRIEF SUMMARY OF THE INVENTION

A main object of the present invention is to provide an electrical connector having a spacing plate which has the same thermal expansion coefficient as a circuit board, and a prepreg displaced between a base and the spacing plate for preventing misalignment between the electrical connector and the circuit board.

To fulfill the above-mentioned object, according to a preferred embodiment of the present invention, an electrical connector for interconnecting an IC module and a circuit board comprises a base, a slide plate, a plurality of contacts, a spacing plate, a prepreg, a cover and a push plate. A plurality of passageways is formed in the base for receiving corresponding contacts. The slide plate is mounted on a top surface of the base, and a plurality of apertures is formed in the slide plate corresponding to the passageways of the base. The spacing plate is mounted to the bottom surface of the base and forms a plurality of positioning holes for receiving soldering portions of the corresponding contacts. The prepreg is disposed between the base and the spacing plate, and a plurality of spacing holes is formed in the prepreg corresponding to the passageways of the base. Since the spacing plate and the circuit board have the same thermal expansion coefficient, the positioning holes remain in alignment with corresponding solder pads formed on the circuit board during a soldering process. Furthermore, the contacts are resilient to compensate for deformation of the electrical connector and the circuit board. Thus, a reliable connection between the circuit board and the IC module is provided.

Other objects, advantages and novel features of the invention will become more apparent from the following detailed description when taken in conjunction with the accompanying drawings.

DETAILED DESCRIPTION OF THE INVENTION

Figure 1A:
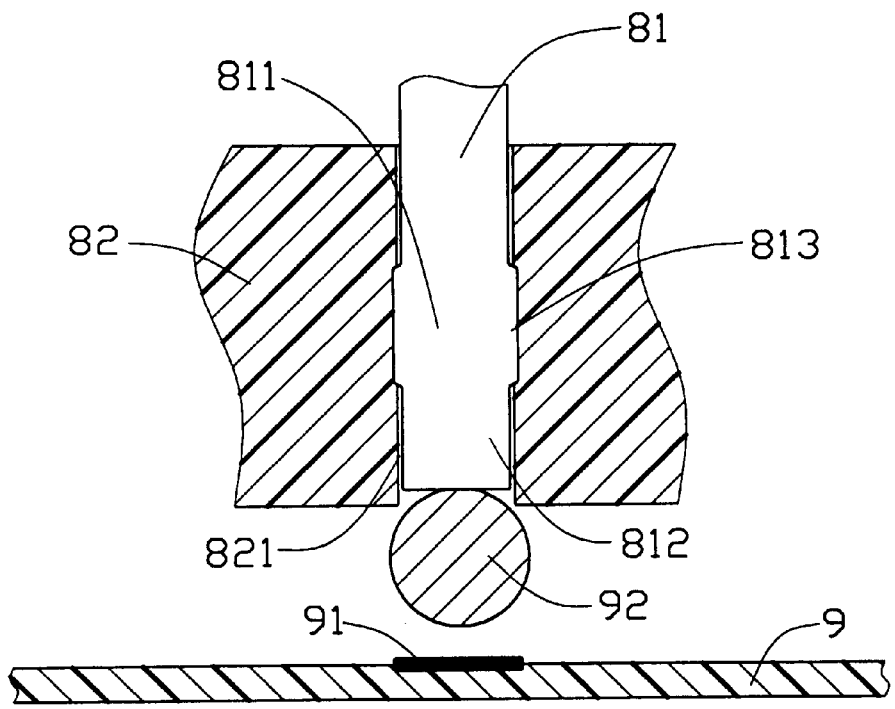
FIG. 1A is a cross-sectional view of a conventional electrical connector to assembled to a circuit board.
Figure 1B:
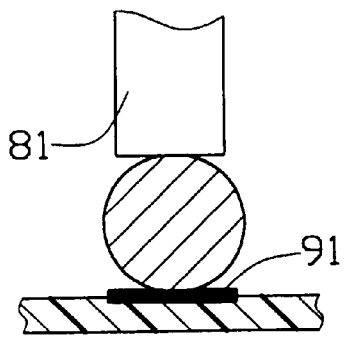
FIG. 1B is a cross-sectional view of a contact of the conventional connector soldered to a circuit board at an ideal position.
Figure 1C:
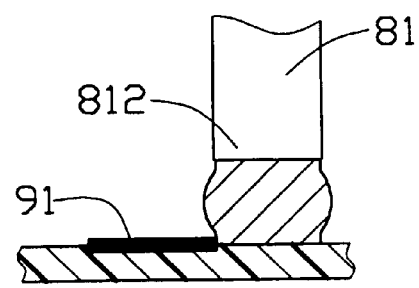
FIG. 1C is a cross-sectional view of the contact of the conventional electrical connector soldered with the circuit board at a misaligned position.

For facilitating understanding, like components are designated by like reference numerals through out the description of the various embodiments as shown in the attached drawing figures.

Figure 2:
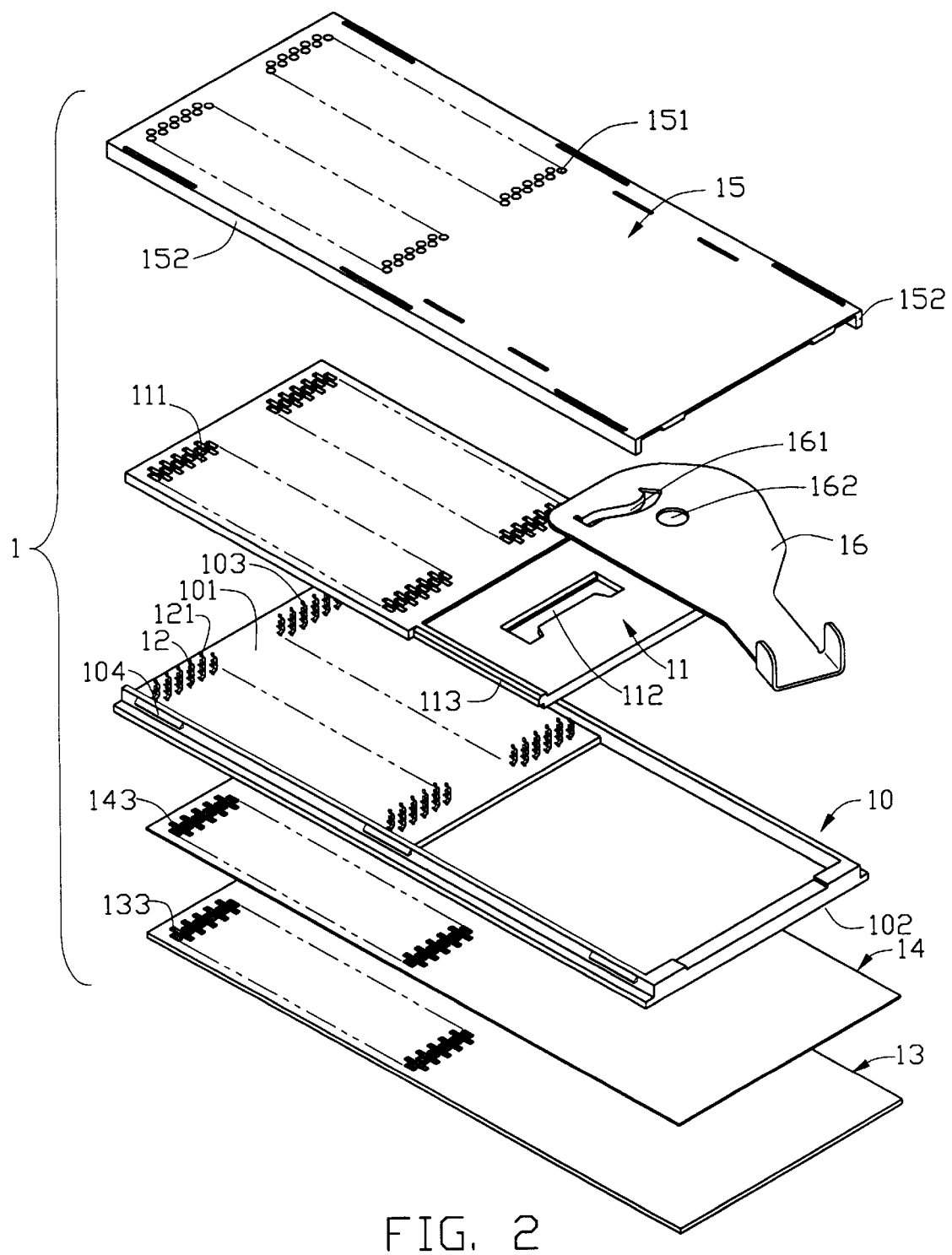
FIG. 2 is an exploded view of an electrical connector in accordance with a first embodiment of the present invention.
Figure 3:
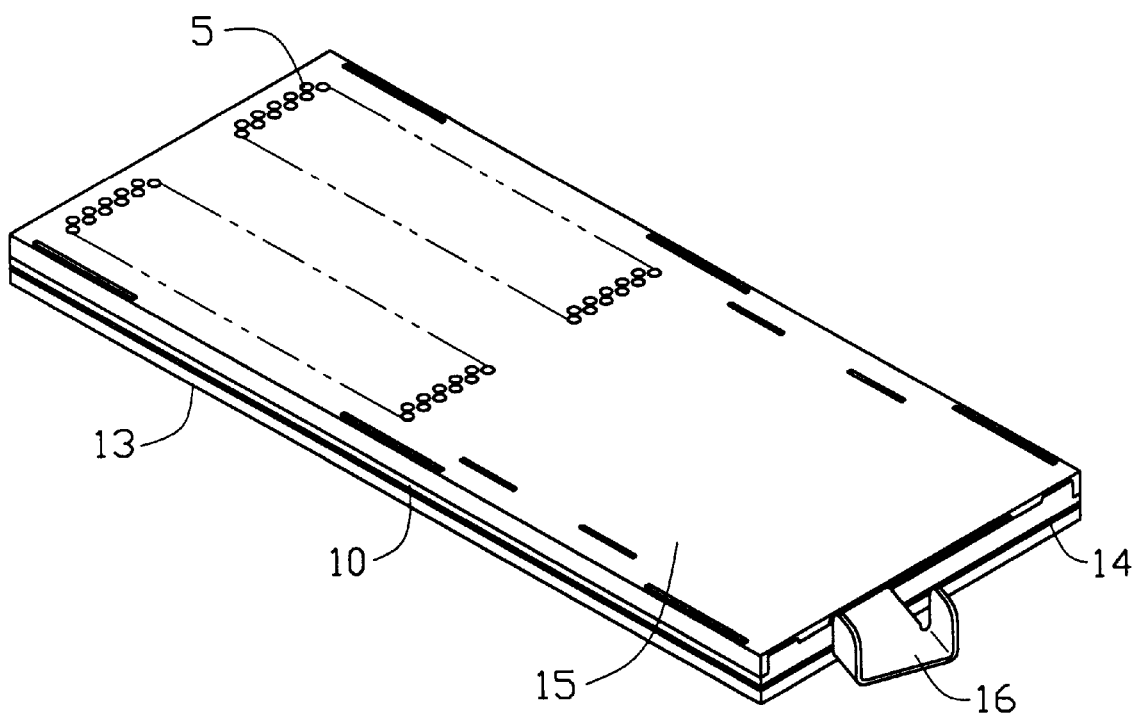
FIG. 3 is an assembled view of FIG. 2.

Referring to FIGS. 2 and 3, an electrical connector 1 comprises a base 10, a slide plate 11, a plurality of first contacts 12, a spacing plate 13, a prepreg 14, a cover 15 and a push plate 16. A plurality of passageways 103 is formed in the base 10 for receiving the corresponding first contacts 12. A plurality of projections 104 is formed on lateral edges of the base 10. The slide plate 11 is mounted on a top surface 101 of the base 10, and a plurality of passageways 111 is formed in the slide plate 11 corresponding to the passageways 103 of the base 10. A pin (not shown) is received in each aperture 111 of the slide plate 11. A slot 112 is formed in the slide plate 11, and a pair of locking ribs 113 is formed on lateral edges of the slide plate 11.

Figure 5:
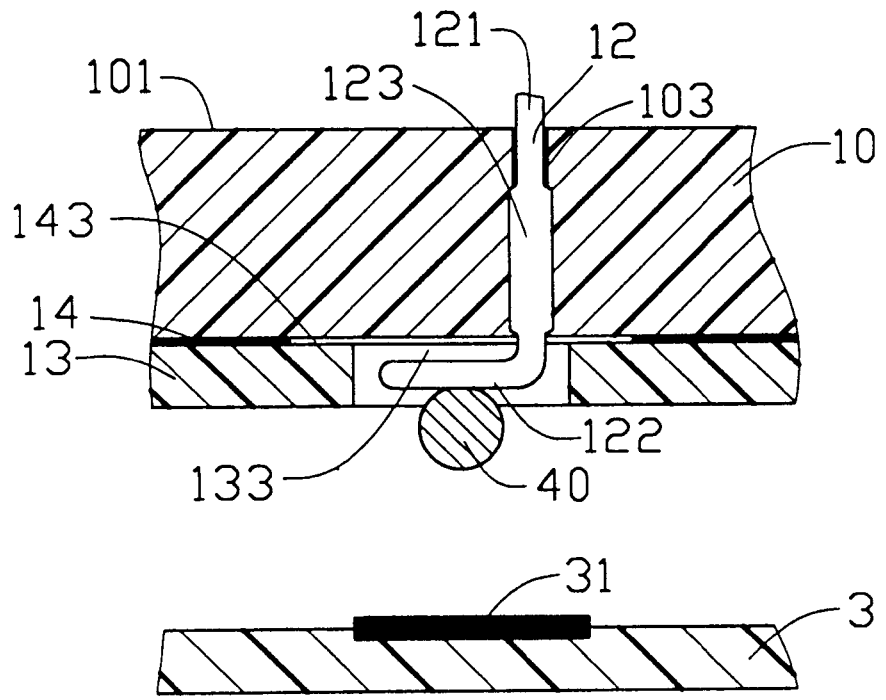
FIG. 5 is a cross-sectional view of the electrical connector being soldered to the circuit board.
Figure 6:
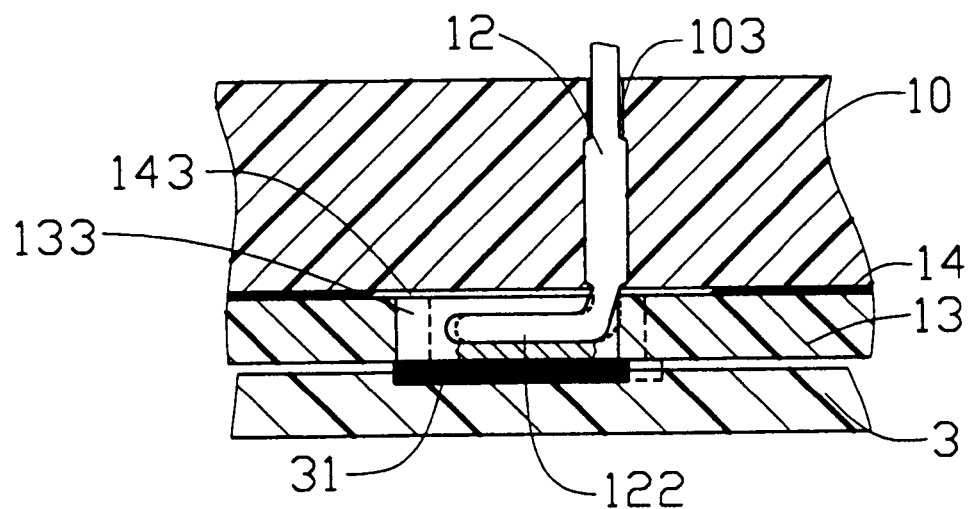
FIG. 6 is a cross-sectional view of the electrical connector after being soldered to the circuit board.

Referring to FIGS. 5 and 6, each first contact 12 is received in the corresponding passageway 103 of the base 10 and comprises a fixing portion 123, a contacting portion 121 and a soldering portion 122. The contacting portion 121 extends beyond a top surface 101 of the base 10 and is received in the corresponding aperture 111 of the slide plate 11. The soldering portion 122 extends beyond a bottom surface 102 of the base 10 and has a solder ball 40 attached thereto. The fixing portion 123 interferentially engages with an inner surface of the passageway 103 for securing the first contact 12 in the base 10. The spacing plate 13 is mounted to the bottom surface 102 of the base 10 and forms a plurality of positioning holes 133 for receiving the soldering portion 122 of the corresponding first contacts 12. The prepreg 14 is disposed between the base 10 and the spacing late 13, and a plurality of spacing holes 143 is formed in the prepreg 14 corresponding to the passageways 103 of the base 10.

Figure 4:
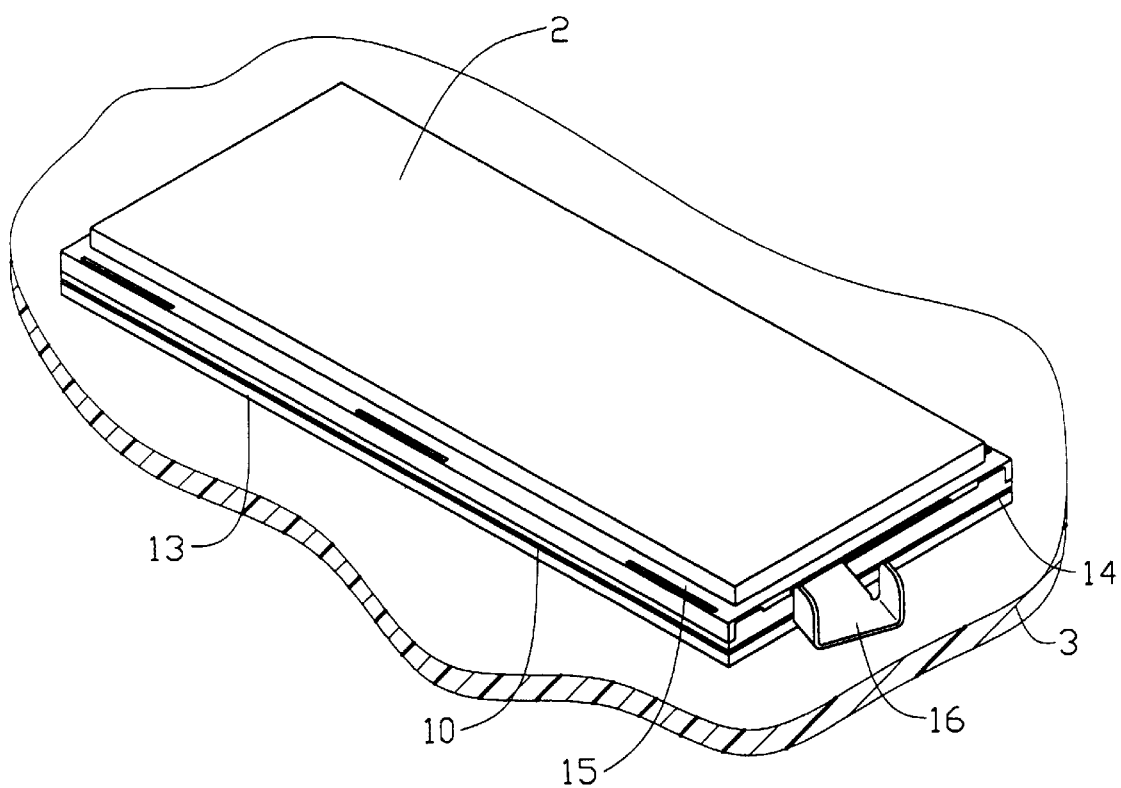
FIG. 4 is an assembled view of the electrical connector interconnecting an IC module and a circuit board.

Referring to FIGS. 2 to 4, the cover 15 is mounted on the slide plate 11, and a plurality of receiving holes 151 is formed in the cover 15 for extension of pins (not shown) of an IC module 2 therethrough. A pair of flanges 152 extend from opposite lateral edges of the cover 15, and a locking recess (not shown) is formed in an inner face of the flanges 152 for engaging with the corresponding locking rib 113 of the slide plate 11. Locking members (not shown) is also formed on the inner face of each flange 152 of the cover 15 for engaging with corresponding projections 104 of the base 10. The push plate 16 is mounted between the slide plate 11 and the cover 15. A folded plate 161 is formed in a middle portion of the push plate 16 for insertion in the slot 112, and a central hole 162 is formed in the push plate 16 for engaging with a post (not shown) formed on the bottom surface of the cover 15. The push plate 16 pivots about the post and the slide plate 11 is driven to slidably move relative to the base 10 and cover 15. Thus, the electrical connector 1 is controlled to move between open and closed positions. At the open position the pins (not shown) in the slide plate 11 disengage from the first contacts 12 in the base 10 and the pins of the IC module 2. At the closed position, the pins in the slide plate 11 simultaneously engage with the first contacts 12 and the pins of the IC module 2.

Referring to FIGS. 3, 5 and 6, the base 10, the prepreg 14 and the spacing plate 13 are assembled together. The soldering portion 122 of each first contact 12 extends into the corresponding positioning hole 133 of the spacing plate 13 and the solder ball 40 is attached thereto. The prepreg 14 becomes molten and slightly viscous after being heated. When the prepreg 14 solidifies and is then reheated, the prepreg 14 is no longer viscous. Under normal temperatures the prepreg 14 is at a solid state and has no viscosity, thus the prepreg 14 is suitable for mechanical processing. After the prepreg 14 is positioned between the base 10 and the spacing plate 13 and then heated, the base 10 adheres to the spacing plate 13 due to the unique properties of the prepreg 14.

Referring to FIGS. 2 to 4, in assembly the IC module 2 is mounted on the cover 15 and the pins of the IC module 2 extend through the corresponding receiving holes 151 of the cover 15 for insertion into the corresponding apertures 111 of the slide plate 11. When the slide plate 11 is driven by manipulating the push plate 16 to the closed position, and pins (not shown) received in apertures 111electrically contact the contacts 12 of the base and the pins of the IC module 2.

Referring to FIGS. 4 to 6, when the electrical connector 1 is assembled to a circuit board 3, the solder balls 40 are melted to connect with a corresponding solder pad 31 of the circuit board 3. Thus, the connector 1 electrically connects the IC module 2 to the circuit board 3. Since the spacing plate 13 and the circuit board 3 have the same thermal expansion coefficient, the positioning holes 133 maintain a proper alignment with the corresponding solder pads 31 during the soldering process. Relative movement is shown in dashed line in FIG. 6. Furthermore, the first contacts 12 are resilient to compensate for deformation of the electrical connector 1 and the circuit board 3.

Figure 7:
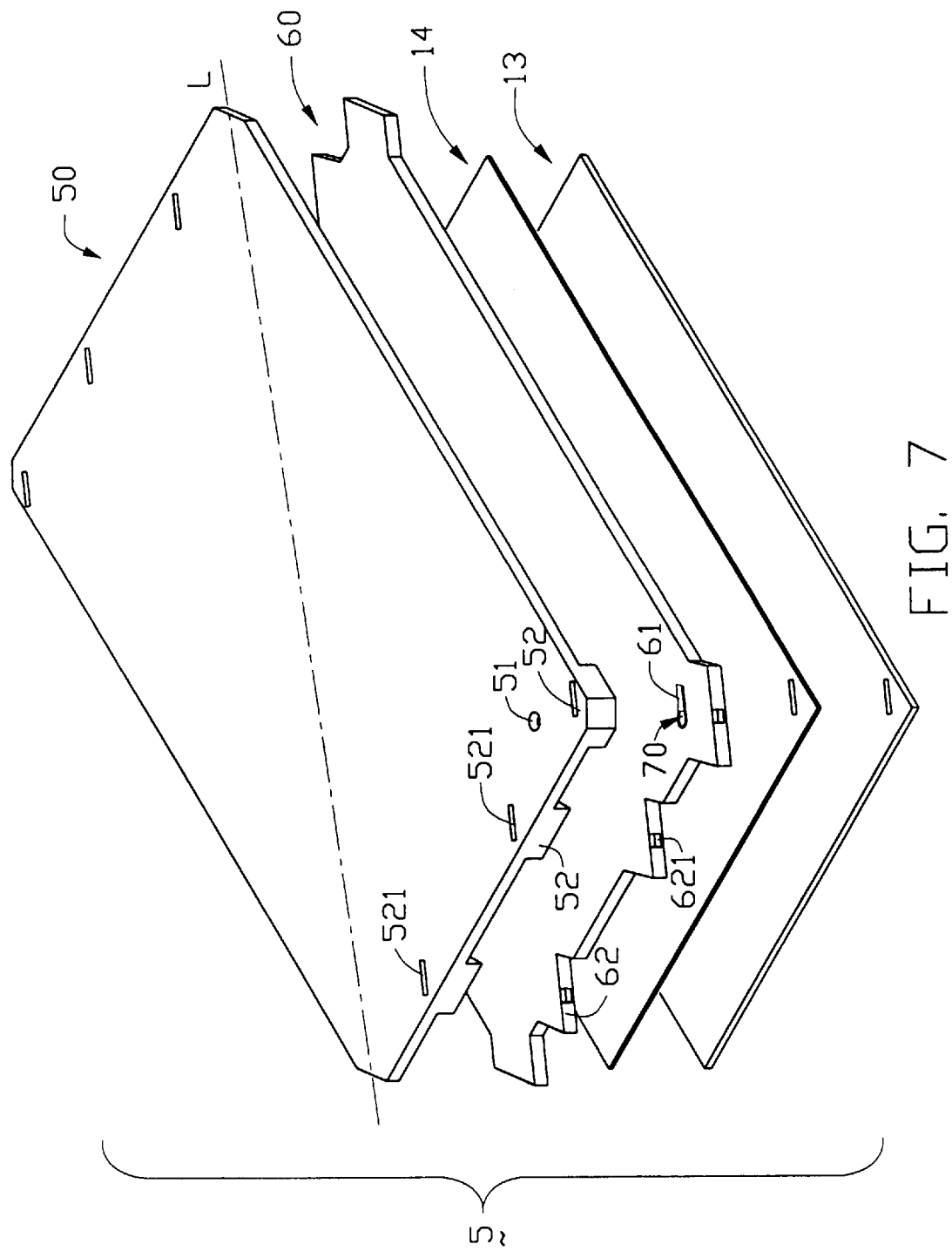
FIG. 7 is an exploded view of the electrical connector in accordance with a second embodiment of the present invention.
Figure 8:
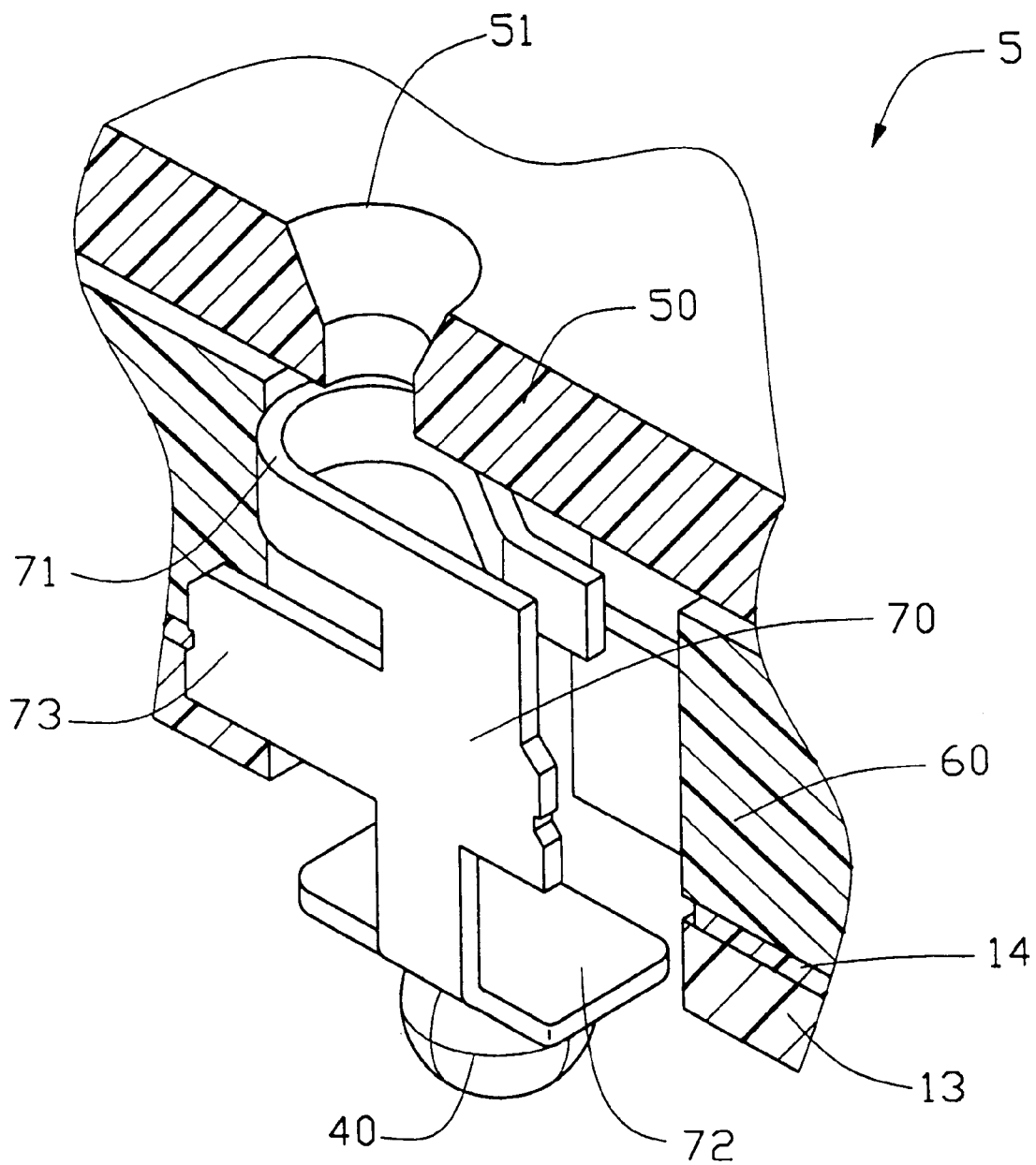
FIG. 8 is a partial, cross-sectional view of the electrical connector of FIG. 7.

FIGS. 7 and 8 illustrate another embodiment of the invention. An electrical connector 5 comprises a cover 50, a base 60, a plurality of contacts 70, the spacing plate 13 and the prepreg 14. A plurality of passageways 51 is formed in the cover 50 for receiving corresponding pins of an IC module (not shown). A plurality of blocks 52 is formed proximate lateral edges of the cover 50. A receiving slot 521 is formed in each block 52 through the cover 50. A plurality of passageways 61 is formed in the base 60 corresponding to the passageways 51 of the cover 50, and a plurality of triangular plates 62 extend from lateral edges of the base 60 for engaging with the corresponding blocks 52. A protrusion 621 is formed on an edge of each triangular plate 62 for engaging with the corresponding receiving slot 521 of the cover 50. Since each receiving slot 521 is formed in the same diagonal direction, the cover 50 slides on the base 60 in the same direction. The contacts 70 are formed by stamping a metal plate and each comprise a fixing portion 73, a contacting portion 71 and a soldering portion 72. The fixing portion 73 engages with the base 60 for securing the contact 70 thereto. The spacing plate 13 has the same thermal expansion coefficient as the circuit board (not shown) and the base 60 is attached to the spacing plate 13 by the prepreg 14. A solder ball 40 is attached to the contact 70 and connects with the circuit board at a proper position during a soldering process. Thus, a reliable connection between the circuit board and the IC module is provided.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

We claim:

1. An electrical connector for electrically interconnecting an IC module and a circuit board, comprising:

a base forming a plurality of passageways;

a plurality of first contacts being received in the passageways of the base, each first contact comprising a fixing portion, a contacting portion and a soldering portion, the fixing portion secured in the passageway, the contacting portion extending out from the passageway for electrically contacting a pin of an IC package, the soldering portion formed with broad receiving surface for ensuring reliable engagement with a solder ball;

a cover being mounted on the base and forming a plurality of receiving holes for receiving corresponding contacts of the IC module;

a spacing plate forming a plurality of positioning holes for positioning the soldering portions of the corresponding contacts received in the base; and a prepreg forming a plurality of spacing holes corresponding to the passageways of the base and being disposed between the base and the spacing plate;

further comprising a slide plate mounted on the base and forming a plurality of apertures, and a plurality of pins received in the apertures of the slide plate for interconnecting the pins of the IC package and the first contacts of the base;

further comprising a push plate mounted between the slide plate and the cover.

2. The electrical connector as claimed in claim 1, wherein the base forms a plurality of projections on lateral edges thereof.

3. The electrical connector as claimed in claim 1, wherein the slide plate forms a pair of locking ribs on lateral edges thereof.

* * * * *